(12) United States Patent
Shimizu

(10) Patent No.: US 7,453,316 B2
(45) Date of Patent: Nov. 18, 2008

(54) AMPLIFIER CIRCUIT

(75) Inventor: Nobuyuki Shimizu, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 107 days.

(21) Appl. No.: 11/533,345

(22) Filed: Sep. 19, 2006

(65) Prior Publication Data

US 2007/0096801 A1 May 3, 2007

(30) Foreign Application Priority Data

Oct. 28, 2005 (JP) ............................. 2005-315016

(51) Int. Cl.
  *H03F 3/38* (2006.01)
(52) U.S. Cl. ...................................................... 330/10
(58) Field of Classification Search ................... 330/10; 375/238
  See application file for complete search history.

(56) References Cited

U.S. PATENT DOCUMENTS

2007/0008031 A1\* 1/2007 Kranz ......................... 330/10

FOREIGN PATENT DOCUMENTS

| JP | 2004-312594 A | 11/2004 |
| JP | 2005-86611 A | 3/2005 |

\* cited by examiner

*Primary Examiner*—Steven J Mottola
(74) *Attorney, Agent, or Firm*—Volentine & Whitt, P.L.L.C.

(57) ABSTRACT

An amplifier circuit includes a first clock generator and a pulse width modulator. The first clock generator outputs a first clock of which frequency is dependent on the voltage level of a power supply voltage. The pulse width modulator generates a signal having a duration proportional to data based on the first clock.

8 Claims, 9 Drawing Sheets

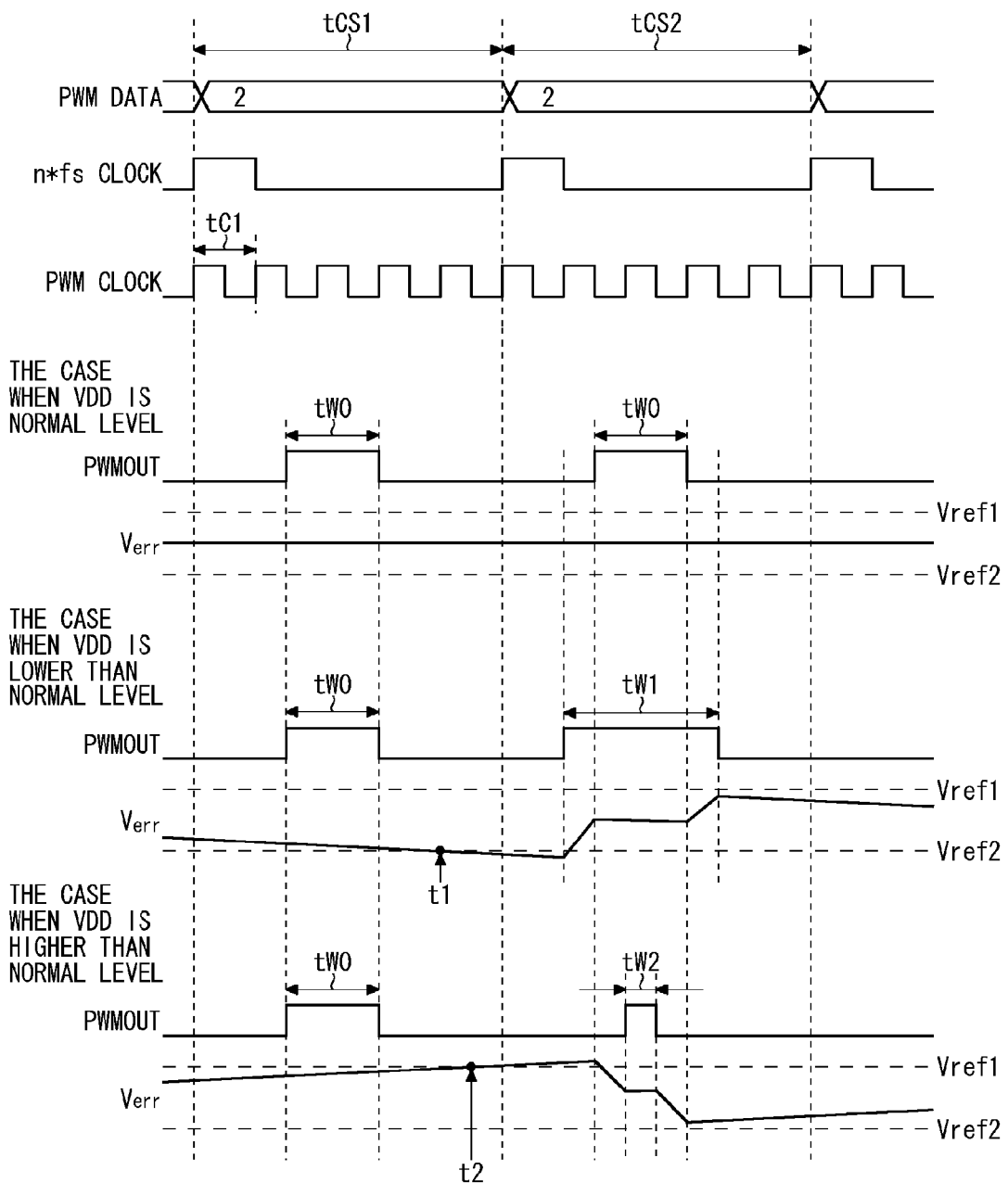

AMPLIFIER CIRCUIT

BACKGROUND OF THE INVENTION

1. Field of the Invention

The present invention relates to an amplifier circuit, particularly to a D class power amplifier circuit.

2. Background Information

Conventionally, in the field of digital audio technology, a technique of converting digital audio data (hereinafter to be referred to as PCM data) encoded by a PCM system into an analog signal using a D/A converter circuit has been used most commonly. Moreover, in driving a speaker using such analog signal, it has been typical that the analog signal is power-amplified by a power amplifier (hereinafter to be referred to as a power amp).

In recent years, most commonly used D/A converter circuits for use in an audio frequency band are the ones adopting a delta sigma modulation system (hereinafter to be referred to as a $\Delta\Sigma$ modulation system). Moreover, as for power amps, although analog amps of B class output structure are commonly used, power amps of D class output structure (hereinafter to be referred to as D class power amps) have been used more often particularly for use in where power efficiency is required.

Such D class power amp usually adopts a system in which an analog input is to be converted into binary data which is being pulse-width-modulated (e.g., Japanese Laid-Open Patent Application No. 2004-312594 (hereinafter to be referred to as patent reference 1)). In this regard, however, in the D/A converter circuit adopting the $\Delta\Sigma$ modulation system, an output signal is mostly being pulse-width-modulated (i.e., a pulse width modulation (PWM) process is done on the output signal). In the following, such output signal being PWM processed will be referred to as a PWM signal. By using this PWM signal as a driving signal for driving an output stage of the D class power amp, it is possible to construct a kind of full digital system D class power amp (e.g., Japanese Laid-Open Patent Application No. 2005-86611 (hereinafter to be referred to as patent reference 2)). In such full digital system D class power amp, since it is not necessary to have any analog signal intervene during signal processing, it is possible to simplify the circuit structure.

However, with respect to the conventional D class power amp, the amplitude of an analog signal, which is the final output signal, in an audio frequency band is supposed to be obtained by a product of a $\Delta\Sigma$ modulated signal and a power supply voltage VDD supplied to a D class output stage, and therefore, there is a problem in that fluctuations in the power supply voltage VDD will have an influence on the analog signal.

In order to solve such problem, it is necessary to inhibit fluctuations in the power supply voltage VDD. For this purpose, normally, a series regulator or a switching regulator is used as a power supply stabilizer. However, with respect to the series regulator, a difference between the supply voltage and the output voltage will result in a power loss. Therefore, there is a problem in that power efficiency will deteriorate. In the meantime, with respect to the switching regulator, although power efficiency is high, it is necessary to use a coil. Therefore, there is a problem in that the packaging volume and weight of a mounting base will be increased. Because of such factors, neither the series regulator nor the switching regulator is appropriate for use in a device such as a portable device that requires high power efficiency and reduced packaging volume and weight.

Now, referring to the above-mentioned patent reference 1, it discloses a technique for preventing an output signal from being influenced by possible fluctuations in a power supply voltage VDD within an analog system D class power amp. However, since the analog system D class power amp and the digital system D class power amp are different in terms of circuit structure, it is not possible to apply the technique disclosed in patent reference 1 to the digital system D class power amp.

In the meantime, referring to the above-mentioned patent reference 2, it discloses a technique for preventing an output signal from being influenced by possible fluctuations in a power supply voltage VDD by comparing the output signal with a predetermined reference signal and feedback-correcting the PCM data based on the comparison result. However, in this technique, it is necessary to arrange a comparatively large feedback loop including a $\Delta\Sigma$ modulation circuit, and therefore, there will be a long delay period, and stable operation of the base apparatus becomes difficult.

In view of the above, it will be apparent to those skilled in the art from this disclosure that there exists a need for an improved amplifier circuit. This invention addresses this need in the art as well as other needs, which will become apparent to those skilled in the art from this disclosure.

SUMMARY OF THE INVENTION

It is therefore an object of the present invention to resolve the above-described problems and to provide a digital system amplifier circuit which is capable of preventing an output signal from being influenced by possible fluctuations in a power supply voltage VDD, preventing power loss from increasing, preventing the packaging volume and weight of a mounting base from increasing, and achieving stable operation.

In accordance with a first aspect of the present invention, an amplifier circuit comprises a first clock generator and a pulse width modulator. The first clock generator outputs a first clock having a frequency which is dependent on the voltage level of a power supply voltage. The pulse width modulator generates a signal having a duration proportional to data based on the first clock.

In accordance with a second aspect of the present invention, an amplifier circuit comprises first and second pulse width modulators, an error integration circuit and a correction circuit. The first pulse width modulator generates a first signal which has a first duration based on a predetermined clock, the first duration being proportional to first data. The second pulse width modulator generates a second signal which has a second duration based on the predetermined clock, the second duration being proportional to second data. The error integration circuit outputs a first value which is obtained by integrating differences between second and third values, the second value being obtained by multiplying a first current being proportional to a power supply voltage by a duration of the first signal, the third value being obtained by multiplying a second current being nonproportional to the power supply voltage by a duration of the second signal. The correction circuit generates the first data by correcting the second data if the first value exceeds a first predetermined value or if the first value falls below a second predetermined value.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure:

FIG. 9 is a waveform diagram showing operation waveforms of signals in the amplifier according to the second embodiment of the present invention.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

First, a first embodiment of the present invention will be described in detail with reference to the drawings. This embodiment will show an example of a D class amplifier circuit (hereinafter to be referred to as an amp) which operates on the basis of two PWM signals which are in a reversed phase relationship. However, the present invention is not limited to such condition, and it may also be a D class amplifier circuit which operates on the basis of a single PWM signal.

Figure 1:
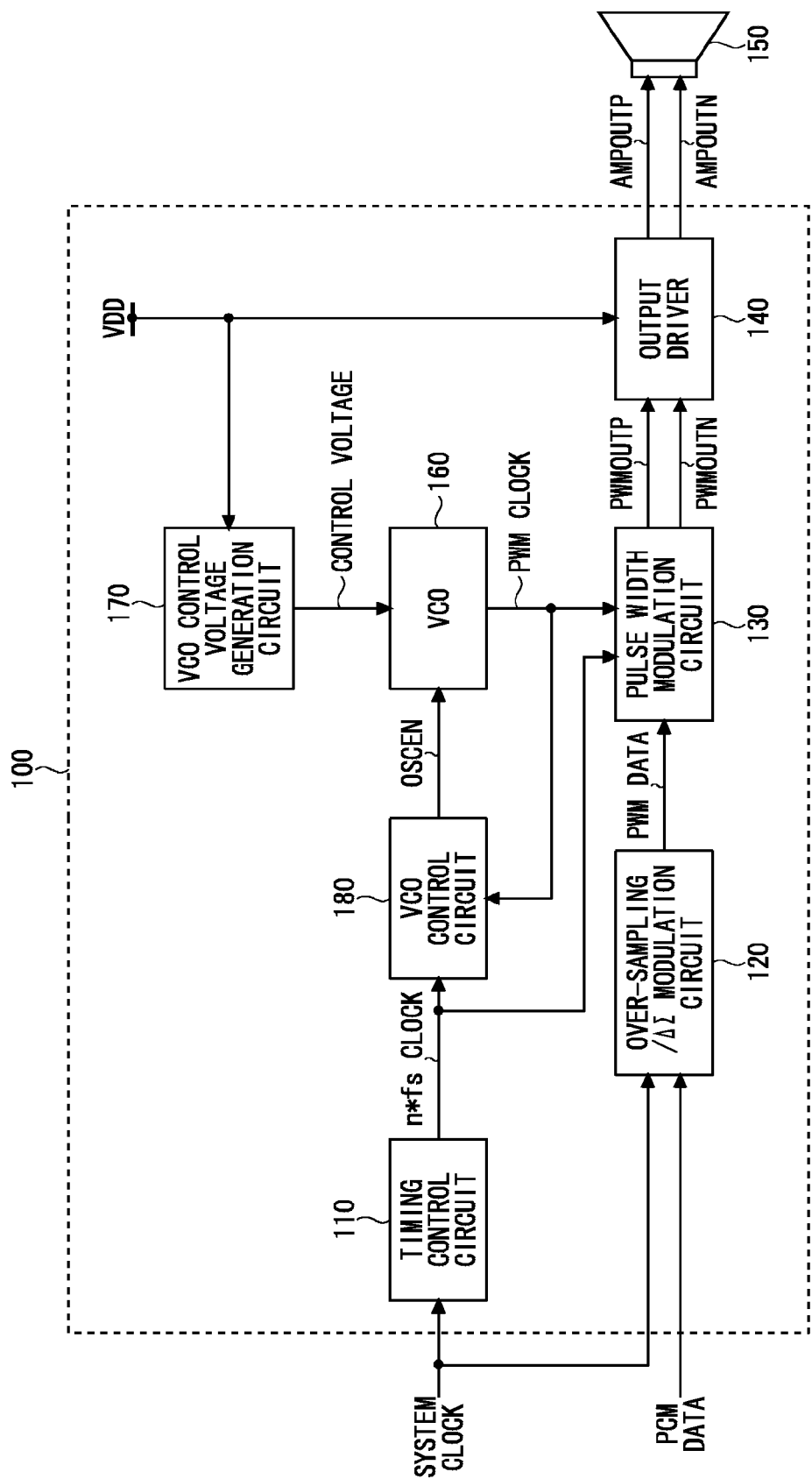
FIG. 1 is a block diagram showing an amplifier according to a first embodiment of the present invention.
Figure 2:
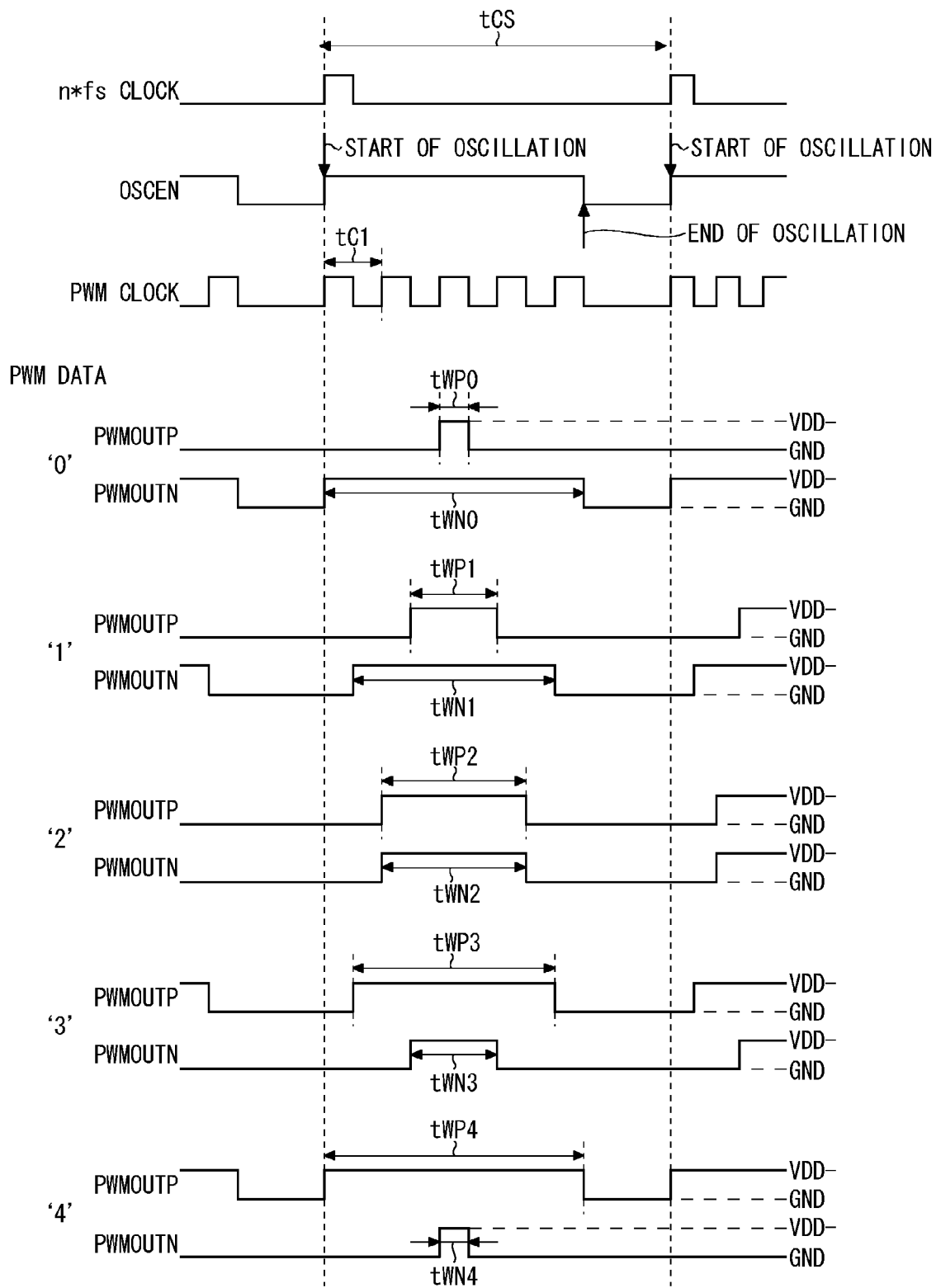
FIG. 2 to FIG. 4 are waveform diagrams showing operation waveforms of the signals in the amplifier according to the first embodiment of the present invention.
Figure 3:
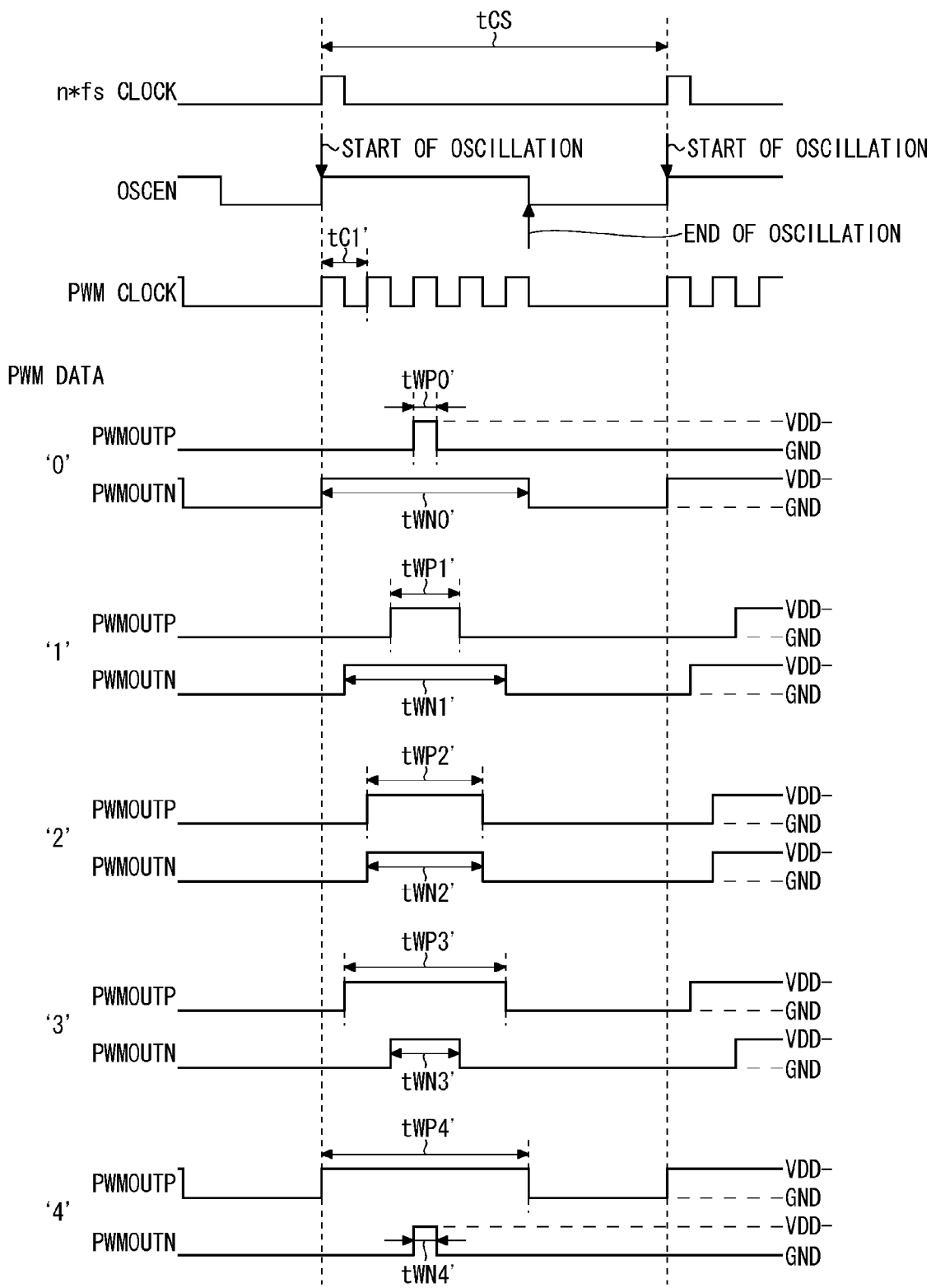
Figure 4:
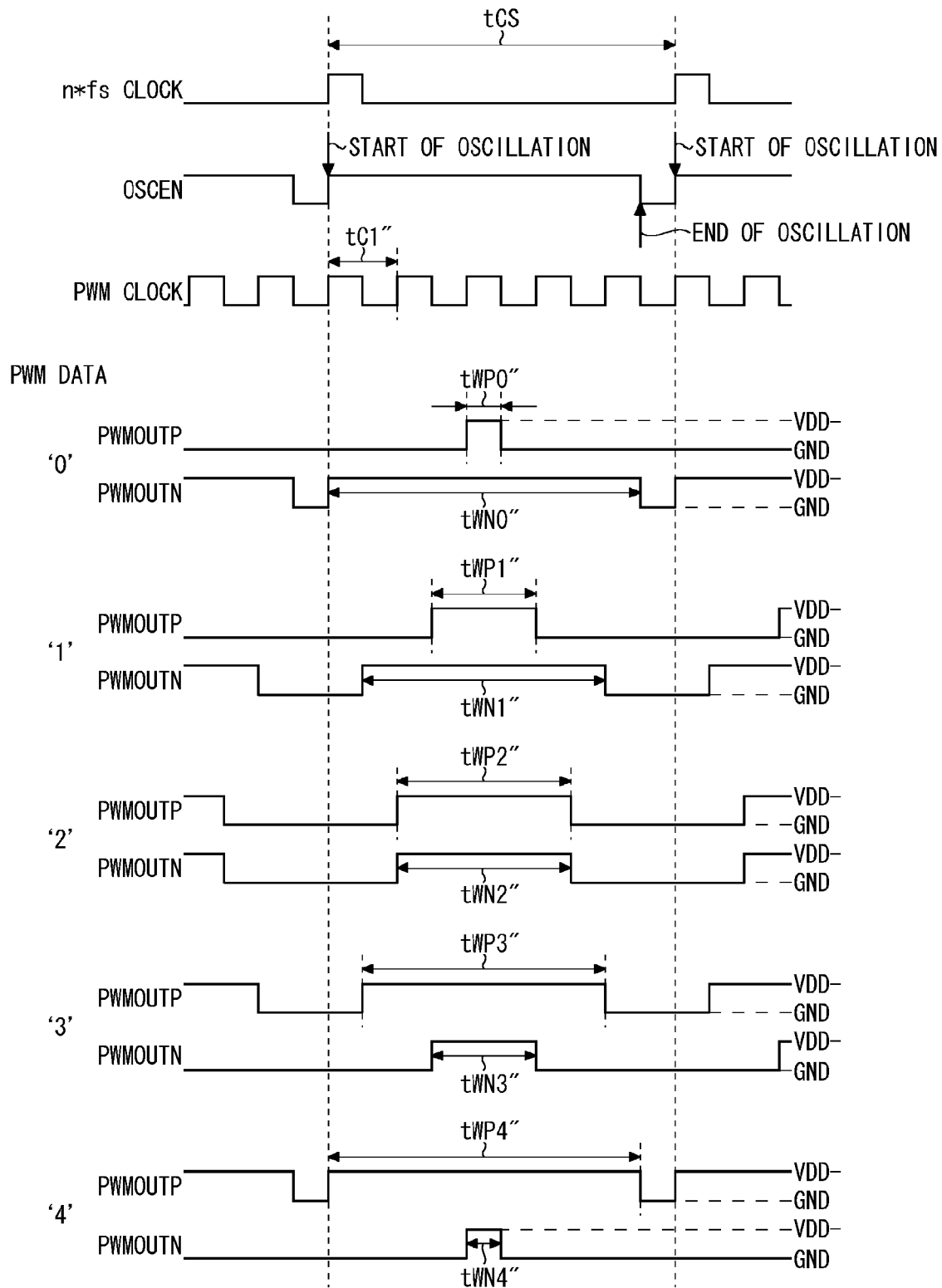

FIG. 1 is a block diagram showing an amp 100 according to the first embodiment of the present invention. FIG. 2 to FIG. 4 are waveform diagrams showing operation waveforms of the signals in the amp 100, under different conditions. FIG. 2 shows operation waveforms of the signals when a power supply voltage VDD is at a normal voltage level. FIG. 3 shows waveforms of the signals when the voltage level of the power supply voltage VDD becomes higher than the normal voltage level. FIG. 4 shows waveforms of the signals when the voltage level of the power supply voltage VDD becomes lower than the normal voltage level.

Structure

Now, the entire structure of the amp 100 according to the first embodiment of the present invention will be described. As shown in FIG. 1, the amp 100 has a timing control circuit 110, an over sampling/ΔΣ modulation circuit 120, a pulse width modulation circuit 130, an output driver 140, a voltage controlled oscillator (hereinafter to be referred to as a VCO) 160, a VCO control voltage generator 170, and a VCO control circuit 180. The amp 100 will drive a speaker 150 using output signals AMPOUTP and AMPOUTN from the output driver 140.

In this structure, the timing control circuit 110 (i.e., second clock generator) is to receive a system clock (i.e., third clock) from an external circuit, frequency-divide this system clock at a predetermined frequency division rate to generate an n*fs clock (i.e., second clock). The generated n*fs clock will be inputted to the pulse width modulation circuit 130 and to the VCO control circuit, which will be described in more detail later on, respectively. Here, the n*fs clock is a signal for specifying a cycle (hereinafter to be referred to as an over sampling cycle) of PWM signals PWMOUTP and PWMOUTN outputted from the pulse width modulation circuit 130. This n*fs clock, as will be described later on, has a cycle which is longer than a predetermined cycle of a PWM clock.

The over sampling/ΔΣ modulation circuit 120 will receive PCM data and a system clock from an external circuit. Then the over sampling/ΔΣ modulation circuit 120 will raise the sampling frequency of the PCM data using the inputted system clock, and after that, the over sampling/ΔΣ modulation circuit 120 will ΔΣ modulate the PCM data to quantize the PCM data. By this process, the PCM data will be converted into PWM data. The PWM data generated in this way will be inputted to the pulse width modulation circuit 130.

In addition to the n*fs clock and the PWM data as mentioned above, the pulse width modulation circuit 130 will receive an oscillation signal from the VCO 160 as a PWM clock. Here, the PWM clock is an operation frequency of the pulse width modulation circuit 130. Based on the inputted PWM clock, PWM data and n*fs clock, the pulse width modulation circuit 130 will generate PWM signals PWMOUTP and PWMOUTN at a predetermined cycle, and output these signals to the output driver 140 in the subsequent stage. Here, the PWM signals PWMOUTP and PWMOUTN have a pulse width (time width) which is proportional to the PWM data. In this way, based on the PWM clock, the pulse width modulation circuit 130 will generate PWM signals PWMOUTP and PWMOUTN with a pulse width proportional to the PWM data.

The output driver 140 is a circuit for current-driving the speaker 150, etc., in the subsequent stage. This output driver 140 will convert the PWM signals PWMOUTP and PWMOUTN received from the pulse width modulation circuit 130 into current signals, and after that, the output driver 140 will amplify these current signals to generate driving signals AMPOUTP and AMPOUTN for driving the speaker 150 in the subsequent stage.

The VCO 160, as mentioned earlier, is an oscillating means for generating a PWM clock (i.e., first clock) which will be an operation frequency of the pulse width modulation circuit 130. Specifically, the VCO 160 will oscillate based on a control voltage received from the VCO control voltage generator 170, which will be described in more detail later on, and output the resultant to the pulse width modulation circuit 130 as a PWM clock. In this way, in this embodiment, the over sampling frequency specified by the n*fs clock and the frequency of the PWM clock for generating the PWM signals PWMOUTP and PWMOUTN are supposed to be independent frequencies. Thereby, it will become possible to modulate the pulse width of the PWM signals PWMOUTP and PWMOUTN without having to depend on an external clock such as a system clock, etc.

The VCO control voltage generator 170 is a circuit for generating a control voltage for oscillating the VCO 160 at a target frequency. The VCO control voltage generator 170 will receive a power supply voltage VDD which is an operation current of the output driver 140, and generate a control voltage based on the received power supply voltage VDD. In other words, the VCO control voltage generator 170 will generate a control voltage having a voltage level proportional to a voltage level of the power supply voltage VDD. Accordingly, the cycle of the PWM clock outputted from the VCO 160 is to fluctuate in conjunction with the fluctuation of the power supply voltage VDD. For instance, when the voltage level of the power supply voltage VDD is lower than a normal voltage level, the VCO control voltage generator 170 will lower the voltage level of the control voltage to be applied to the VCO 160, and thus decrease the oscillation frequency of the VCO 160. Thereby, the cycle of the PWM clock outputted from the VCO 160 will become longer. On the other hand, when the voltage level of the power supply voltage VDD is higher than the normal voltage level, the VCO control voltage generator 170 will raise the voltage level of the control voltage to be applied to the VCO 160, and thus increase the oscillation frequency of the VCO 160. Thereby, the cycle of the PWM clock outputted from the VCO 160 will become shorter.

In this way, the VCO 160 and the VCO control voltage generator 170 are supposed to function as a circuit (i.e., a first clock generator) for generating a PWM clock with a frequency dependent on the voltage level of the power supply voltage VDD.

The VCO control circuit 180 is a circuit for controlling the VCO 160 to be turned ON/OFF. As mentioned earlier, the VCO control circuit 180 will receive the n*fs clock outputted from the timing control circuit 110 and the PWM clock outputted from the VCO 160 at the same time. In response to the input of the n*fs clock, the VCO control circuit 180 will output an oscillation enable signal OSCEN for allowing the VCO 160 to oscillate, and count the PWM clock using a counter (not shown). After that, as the count number of the PWM clock reaches a predetermined number, the VCO control circuit 180 will reset the count number and stop outputting the oscillation enable signal OSCEN. In the meantime, the VCO 160 has a control terminal for controlling the ON/OFF thereof, and it is configured to oscillate only during the period of time when the oscillation enable signal OSCEN is inputted thereto. In this way, when a predetermined period of cycles (i.e., in this embodiment, a period of 4.5 cycles, as will be mentioned later on) of the PWM clock passes after the n*fs clock rises, the VCO control circuit 180 will terminate the VCO 160 until the next n*fs clock rises.

Average Voltage of PWM Signal

Now, an average voltage of the PWM signals PWMOUTP and PWMOUTN to be outputted from the pulse width modulation circuit 130, in terms of one over sampling cycle, will be explained. As mentioned earlier, the PWM signal PWMOUTP on the positive phase side and the PWM signal PWMOUTN on the negative phase side are in a reversed phase relationship. Therefore, explanation will be given only on the PWM signal PWMOUTP on the positive phase side.

Provided that the cycle of the PWM clock is 'tC' and the PWM data is 'Dpwm', the pulse width 'tWP' of the PWM signal PWMOUTP can be expressed by the following Formula 1.

$$tWP = tC \times (Dpwm + 0.5) \quad \text{Formula 1}$$

Accordingly, provided that the over sampling cycle is 'tCS' and the voltage level of the power supply voltage is 'VDD', the average voltage 'Vo' of the PWM signal PWMOUTP in one over sampling cycle can be expressed by the following Formula 2.

$$\begin{aligned} Vo &= VDD \times \frac{tWP}{tCS} \\ &= VDD \times (Dpwm + 0.5) \times \frac{tC}{tCS} \\ &= (VDD \times tC) \times \left( \frac{Dpwm + 0.5}{tCS} \right) \end{aligned} \quad \text{Formula 2}$$

In this embodiment, the characteristic of the VCO control voltage generator 170 is to be determined such that a relation tC=k1/VDD (k1 is a constant number) can be established. Accordingly, Formula 2 as shown above will become the following Formula 3, and thereby the average voltage Vo will become independent of changes in the power supply voltage VDD.

$$Vo = k1 \times \left( \frac{Dpwm + 0.5}{tCS} \right) \quad \text{Formula 3}$$

In this way, by setting the characteristic of the VCO control voltage generator 170 such that the relation tC=k1/VDD (k1 is a constant number) can be established, it is possible to make the average voltage Vo of the PWM signal PWMOUTP in one over sampling cycle become independent of changes in the power supply voltage VDD. As a result, the output signal AMPOUTP to be outputted from the output driver 140 can be stabilized. It is also possible to make the average voltage of the PWM signal PWMOUTN on the negative phase side in one over sampling cycle become independent of changes in the power supply voltage VDD, in the same way as the PWM signal PWMOUTP on the positive phase side. Accordingly, the output signal AMPOUTN to be outputted from the output driver 140 can be stabilized.

Operation

Now, operation of the amp 100 according to the first embodiment of the present invention will be explained. In the following explanation, a case in which the PWM data is five-valued data will be shown. When the PWM data is '0', for instance, the pulse width of the PWM signals PWMOUTP and PWMOUTN to be generated at the pulse width modulation circuit 130 will be as much as 0.5 cycles and 4.5 cycles of the PWM clock, respectively. When the PWM data is '1', for instance, the pulse width of the PWM signals PWMOUTP and PWMOUTN will be as much as 1.5 cycles and 3.5 cycles of the PWM clock, respectively. When the PWM data is '2', for instance, the pulse width of the PWM signals PWMOUTP and PWMOUTN will be as much as 2.5 cycles and 2.5 cycles of the PWM clock, respectively. When the PWM data is '3', for instance, the pulse width of the PWM signals PWMOUTP and PWMOUTN will be as much as 3.5 cycles and 1.5 cycles of the PWM clock, respectively. When the PWM data is '4', for instance, the pulse width of the PWM signals PWMOUTP and PWMOUTN will be as much as 4.5 cycles and 0.5 cycles of the PWM clock, respectively. Accordingly, in these cases, the pulse width of the PWM signals PWMOUTP and PWMOUTN will be within a range under 4.5 cycles. Moreover, in this embodiment, as mentioned earlier, the oscillation frequency of the VCO 160 is supposed to change according to the voltage level of the power supply voltage VDD. In other words, the pulse width tC of one cycle of the PWM clock (hereinafter to be referred to as the cycle of the PWM clock) is supposed to change according to the voltage level of the power supply voltage VDD. In this embodiment, therefore, the over sampling cycle tCS for outputting a pair of PWM signals PWMOUTP and PWMOUTN will be set to a cycle longer than 4.5 cycles of the PWM clock at the time when the power supply voltage VDD took a predictable maximum value. That is, in this embodiment, the over sampling cycle tCS includes a margin (also called an extra period) for coping with possible changes of the PWM clock. In other words, the n*fs clock to be generated at the timing control circuit 110 is generated such that it will have a cycle that is longer than the predetermined cycle (i.e., as much as 4.5 cycles in this embodiment) of the PWM clock.

When Power Supply Voltage VDD is at Normal Voltage Level

First, a case in which the power supply voltage VDD to be supplied to the output driver 140 is at a normal voltage level will be described with reference to FIG. 2. In this operation, the VCO control voltage generator 170 outputs a control voltage having a voltage level based on the power supply voltage VDD which is at the normal voltage level. The cycle of the PWM clock to be outputted from the VCO 160 at this time will be regarded as tC1.

Here, as shown in FIG. 2, when the n*fs clock indicating a start of the over sampling cycle is outputted from the timing control circuit 110 to the VCO control circuit 180, the VCO control circuit 180 will reset a counter (not shown) at a rising edge of the n*fs clock and assert the oscillation enable signal OSCEN with respect to the VCO 160. Thereby, the VCO 160 will start oscillating based on the control voltage inputted from the VCO control voltage generator 170, i.e., based on the control voltage having a voltage level at normal times. Then the signal oscillated at the VCO 160 will be inputted to the pulse width modulation circuit 130 and the VCO control circuit 180, respectively, as a PWM clock having a cycle tC1.

As mentioned earlier, the VCO control circuit 180, to which the PWM clock is inputted, counts the number of PWM clock inputs with the counter (not shown). For instance, at a falling edge of the PWM clock, the VCO control circuit 180 will increment the count number of the counter by as much as one. Moreover, when the number of PWM clocks necessary for generating the PWM signals PWMOUTP and PWMOUTN for one cycle are inputted, the VCO control circuit 180 will deassert the oscillation enable signal OSCEN which was asserted with respect to the VCO 160. In this embodiment, when the count number of the counter becomes '5', the VCO control circuit 180 will stop outputting the oscillation enable signal OSCEN. Thereby the VCO 160 will stop oscillating.

In this way, in this embodiment, by stopping the VCO 160 and thus stop outputting the PWM clock during the extra period in the over sampling cycle, it is possible to prevent the start timing of the next over sampling cycle and the rising edge of the PWM clock from going out of alignment.

In the meantime, to the pulse width modulation circuit 130 to which the PWM clock is inputted, the PWM data outputted from the over sampling/$\Delta\Sigma$ modulation circuit 120 is also inputted.

Here, if the PWM data is '0', for instance, the pulse width modulation circuit 130 will output a PWM signal having a pulse width of 0.5 cycles of the PWM clock, as a PWM signal PWMOUTP on the positive phase side, and will output a PWM signal having a pulse width of 4.5 cycles of the PWM clock, as a PWM signal PWMOUTN on the negative phase side. Accordingly, a pulse width tWP0 of the PWM signal PWMOUTP on the positive phase side will become 0.5 times the cycle tC1, i.e., 0.5tC1. As a result, an average voltage VoP0 of the output signal AMPOUTP on the positive phase side outputted from the output driver 140 in one over sampling cycle will be "k1×0.5/tCS", which can be obtained by the above-mentioned Formula 3 and shown as "VoP0=k1×(0+0.5)/tCS=k1×0.5/tCS". On the other hand, a pulse width tWN0 of the PWM signal PWMOUTN on the negative phase side will become 4.5 times the cycle tC1, i.e., 4.5tC1. As a result, an average voltage VoN0 of the output signal AMPOUTN on the negative phase side outputted from the output driver 140 in one over sampling cycle will be "k1×4.5/tCS", which can be obtained by the above-mentioned Formula 3 and shown as "VoN0=k1×(4+0.5)/tCS=k1×4.5/tCS".

If the PWM data is '1', for instance, a pulse width tWP1 of the PWM signal PWMOUTP on the positive phase side will become 1.5 times the cycle tC1, i.e., 1.5tC1. As a result, an average voltage VoP1 of the output signal AMPOUTP on the positive phase side outputted from the output driver 140 in one over sampling cycle will be "k1×1.5/tCS", which can be obtained by the above-mentioned Formula 3 and shown as "VoP1=k1×(1+0.5)/tCS=k1×1.5/tCS". On the other hand, a pulse width tWN1 of the PWM signal PWMOUTN on the negative phase side will become 3.5 times the cycle tC1, i.e., 3.5tC1. As a result, an average voltage VoN1 of the output signal AMPOUTN on the negative phase side outputted from the output driver 140 in one over sampling cycle will be "k1×3.5/tCS", which can be obtained by the above-mentioned Formula 3 and shown as "VoN1=k1×(3+0.5)/tCS=k1×3.5/tCS".

If the PWM data is '2', for instance, a pulse width tWP2 of the PWM signal PWMOUTP on the positive phase side will become 2.5 times the cycle tC1, i.e., 2.5tC1. As a result, an average voltage VoP2 of the output signal AMPOUTP on the positive phase side outputted from the output driver 140 in one over sampling cycle will be "k1×2.5/tCS", which can be obtained by the above-mentioned Formula 3 and shown as "VoP2=k1×(2+0.5)/tCS=k1×2.5/tCS". On the other hand, a pulse width tWN2 of the PWM signal PWMOUTN on the negative phase side will become 2.5 times the cycle tC1, i.e., 2.5tC1. As a result, an average voltage VoN2 of the output signal AMPOUTN on the negative phase side outputted from the output driver 140 in one over sampling cycle will be "k1×2.5/tCS", which can be obtained by the above-mentioned Formula 3 and shown as "VoN2=k1×(2+0.5)/tCS=k1×2.5/tCS".

If the PWM data is '3', for instance, a pulse width tWP3 of the PWM signal PWMOUTP on the positive phase side will become 3.5 times the cycle tC1, i.e., 3.5tC1. As a result, an average voltage VoP3 of the output signal AMPOUTP on the positive phase side outputted from the output driver 140 in one over sampling cycle will be "k1×3.5/tCS", which can be obtained by the above-mentioned Formula 3 and shown as "VoP3=k1×(3+0.5)/tCS=k1×3.5/tCS". On the other hand, a pulse width tWN3 of the PWM signal PWMOUTN on the negative phase side will become 1.5 times the cycle tC1, i.e., 1.5tC1. As a result, an average voltage VoN3 of the output signal AMPOUTN on the negative phase side outputted from the output driver 140 in one over sampling cycle will be "k1×1.5/tCS", which can be obtained by the above-mentioned Formula 3 and shown as "VoN3=k1×(1+0.5)/tCS=k1×1.5/tCS".

If the PWM data is '4', for instance, a pulse width tWP4 of the PWM signal PWMOUTP on the positive phase side will become 4.5 times the cycle tC1, i.e., 4.5tC1. As a result, an average voltage VoP4 of the output signal AMPOUTP on the positive phase side outputted from the output driver 140 in one over sampling cycle will be "k1×4.5/tCS", which can be obtained by the above-mentioned Formula 3 and shown as "VoP4=k1×(4+0.5)/tCS=k1×4.5/tCS". On the other hand, a pulse width tWN4 of the PWM signal PWMOUTN on the negative phase side will become 0.5 times the cycle tC1, i.e., 0.5tC1. As a result, an average voltage VoN4 of the output signal AMPOUTN on the negative phase side outputted from the output driver 140 in one over sampling cycle will be "k1×0.5/tCS", which can be obtained by the above-mentioned Formula 3 and shown as "VoN4=k1×(0+0.5)/tCS=k1×0.5/tCS".

When Power Supply Voltage VDD is Higher than Normal Voltage Level

Next, a case in which the power supply voltage VDD to be supplied to the output driver 140 is higher than a normal voltage level will be described with reference to FIG. 3. In this operation, the VCO control voltage generator 170 outputs a control voltage having a voltage level based on the power supply voltage VDD which is higher than the normal voltage level. Therefore, the cycle of the PWM clock to be outputted from the VCO 160 will become tC1' (<tC1), which is shorter than in the case where the power supply voltage VDD is at normal voltage level.

Here, as shown in FIG. 3, when the n*fs clock indicating a start of the over sampling cycle is outputted from the timing control circuit 110 to the VCO control circuit 180, the VCO control circuit 180 will reset a counter (not shown) at a rising edge of the n*fs clock and assert the oscillation enable signal OSCEN with respect to the VCO 160. Thereby, the VCO 160 will start oscillating based on the control voltage inputted from the VCO control voltage generator 170, i.e., based on the control voltage having a higher voltage level than a voltage level at normal times. Then the signal oscillated at the VCO 160 will be inputted to the pulse width modulation circuit 130 and the VCO control circuit 180, respectively, as a PWM clock having a cycle tC1' (<tC1).

As mentioned earlier, the VCO control circuit 180, to which the PWM clock is inputted, counts the number of PWM clock inputs with the counter (not shown). For instance, at a falling edge of the PWM clock, the VCO control circuit 180 will increment the count number of the counter by as much as one. Moreover, when the number of PWM clocks necessary for generating the PWM signals PWMOUTP and PWMOUTN for one cycle are inputted, the VCO control circuit 180 will deassert the oscillation enable signal OSCEN which was asserted with respect to the VCO 160. In this embodiment, when the count number of the counter becomes '5', the VCO control circuit 180 will stop outputting the oscillation enable signal OSCEN. Thereby, the VCO 160 will stop oscillating.

In this way, in this embodiment, by stopping the VCO 160 and thus stopping the output of the PWM clock during the extra period in the over sampling cycle, it is possible to prevent the start timing of the next over sampling cycle and the rising edge of the PWM clock from going out of alignment.

In the meantime, to the pulse width modulation circuit 130 to which the PWM clock is inputted, the PWM data outputted from the over sampling/ΔΣ modulation circuit 120 is also inputted.

Here, if the PWM data is '0', for instance, the pulse width modulation circuit 130 will output a PWM signal having a pulse width of 0.5 cycles of the PWM clock, as a PWM signal PWMOUTP on the positive phase side, and will output a PWM signal having a pulse width of 4.5 cycles of the PWM clock, as a PWM signal PWMOUTN on the negative phase side, as mentioned earlier. Accordingly, a pulse width tWP0' of the PWM signal PWMOUTP on the positive phase side will become 0.5 times the cycle tC1', i.e., 0.5tC1'. As a result, an average voltage VoP0' of the output signal AMPOUTP on the positive phase side outputted from the output driver 140 in one over sampling cycle will be "k1×0.5/tCS", which can be obtained by the above-mentioned Formula 3 and shown as "VoP0'=k1×(0+0.5)/tCS=k1×0.5/tCS". As can be seen from this value, the average voltage VoP0' of the output signal AMPOUTP on the positive phase side in one over sampling cycle is the same as the average voltage VoP0 to be outputted at the time when the voltage level is normal. In other words, it is not influenced by fluctuations in the power supply voltage VDD.

On the other hand, a pulse width tWN0' of the PWM signal PWMOUTN on the negative phase side will become 4.5 times the cycle tC1', i.e., 4.5tC1'. As a result, an average voltage VoN0' of the output signal AMPOUTN on the negative phase side outputted from the output driver 140 in one over sampling cycle will be "k1×4.5/tCS", which can be obtained by the above-mentioned Formula 3 and shown as "VoN0'=k1×(4+0.5)/tCS=k1×4.5/tCS". As can be seen from this value, the average voltage VoN0' of the output signal AMPOUTN on the negative phase side in one over sampling cycle is also the same as the average voltage VoN0 to be outputted at the time when the voltage level is normal. In other words, it is not influenced by fluctuations in the power supply voltage VDD.

If the PWM data is '1', for instance, a pulse width tWP1' of the PWM signal PWMOUTP on the positive phase side will become 1.5 times the cycle tC1', i.e., 1.5tC1'. As a result, an average voltage VoP1' of the output signal AMPOUTP on the positive phase side outputted from the output driver 140 in one over sampling cycle will be "k1×1.5/tCS", which can be obtained by the above-mentioned Formula 3 and shown as "VoP1'=k1×(1+0.5)/tCS=k1×1.5/tCS". As can be seen from this value, the average voltage VoP1' of the output signal AMPOUTP on the positive phase side in one over sampling cycle is the same as the average voltage VoP1 to be outputted at the time when the voltage level is normal. In other words, it is not influenced by fluctuations in the power supply voltage VDD.

On the other hand, a pulse width tWN1' of the PWM signal PWMOUTN on the negative phase side will become 3.5 times the cycle tC1', i.e., 3.5tC1'. As a result, an average voltage VoN1' of the output signal AMPOUTN on the negative phase side outputted from the output driver 140 in one over sampling cycle will be "k1×3.5/tCS", which can be obtained by the above-mentioned Formula 3 and shown as "VoN1'=k1×(3+0.5)/tCS=k1×3.5/tCS". As can be seen from this value, the average voltage VoN1' of the output signal AMPOUTN on the negative phase side in one over sampling cycle is also the same as the average voltage VoN1 to be outputted at the time when the voltage level is normal. In other words, it is not influenced by fluctuations in the power supply voltage VDD.

If the PWM data is '2', for instance, a pulse width tWP2' of the PWM signal PWMOUTP on the positive phase side will become 2.5 times the cycle tC1', i.e., 2.5tC1'. As a result, an average voltage VoP2' of the output signal AMPOUTP on the positive phase side outputted from the output driver 140 in one over sampling cycle will be "k1×2.5/tCS" which can be obtained by the above-mentioned Formula 3 and shown as "VoP2'=k1×(2+0.5)/tCS=k1×2.5/tCS". As can be seen from this value, the average voltage VoP2' of the output signal AMPOUTP on the positive phase side in one over sampling cycle is the same as the average voltage VoP2 to be outputted at the time when the voltage level is normal. In other words, it is not influenced by fluctuations in the power supply voltage VDD.

On the other hand, a pulse width tWN2' of the PWM signal PWMOUTN on the negative phase side will become 2.5 times the cycle tC1', i.e., 2.5tC1'. As a result, an average voltage VoN2' of the output signal AMPOUTN on the negative phase side outputted from the output driver 140 in one over sampling cycle will be "k1×2.5/tCS", which can be obtained by the above-mentioned Formula 3 and shown as "VoN2'=k1×(2+0.5)/tCS=k1×2.5/tCS". As can be seen from this value, the average voltage VoN2' of the output signal AMPOUTN on the negative phase side in one over sampling cycle is also the same as the average voltage VoN2 to be outputted at the time when the voltage level is normal. In other words, it is not influenced by fluctuations in the power supply voltage VDD.

If the PWM data is '3', for instance, a pulse width tWP3' of the PWM signal PWMOUTP on the positive phase side will become 3.5 times the cycle tC1', i.e., 3.5tC1'. As a result, an average voltage VoP3' of the output signal AMPOUTP on the positive phase side outputted from the output driver 140 in one over sampling cycle will be "k1×3.5/tCS", which can be obtained by the above-mentioned Formula 3 and shown as "VoP3'=k1×(3+0.5)/tCS=k1×3.5/tCS". As can be seen from this value, the average voltage VoP3' of the output signal AMPOUTP on the positive phase side in one over sampling cycle is the same as the average voltage VoP3 to be outputted at the time when the voltage level is normal. In other words, it is not influenced by fluctuations in the power supply voltage VDD.

On the other hand, a pulse width tWN3' of the PWM signal PWMOUTN on the negative phase side will become 1.5 times the cycle tC1', i.e., 1.5tC1'. As a result, an average voltage VoN3' of the output signal AMPOUTN on the negative phase side outputted from the output driver 140 in one over sampling cycle will be "k1×1.5/tCS", which can be obtained by the above-mentioned Formula 3 and shown as "VoN3'=k1×(1+0.5)/tCS=k1×1.5/tCS". As can be seen from this value, the average voltage VoN3' of the output signal AMPOUTN on the negative phase side in one over sampling cycle is also the same as the average voltage VoN3 to be outputted at the time when the voltage level is normal. In other words, it is not influenced by fluctuations in the power supply voltage VDD.

If the PWM data is '4', for instance, a pulse width tWP4' of the PWM signal PWMOUTP on the positive phase side will become 4.5 times the cycle tC1', i.e., 4.5tC1'. As a result, an average voltage VoP4' of the output signal AMPOUTP on the positive phase side outputted from the output driver 140 in one over sampling cycle will be "k1×4.5/tCS", which can be obtained by the above-mentioned Formula 3 and shown as "VoP4'=k1×(4+0.5)/tCS=k1×4.5/tCS". As can be seen from this value, the average voltage VoP4' of the output signal AMPOUTP on the positive phase side in one over sampling cycle is the same as the average voltage VoP4 to be outputted at the time when the voltage level is normal. In other words, it is not influenced by fluctuations in the power supply voltage VDD.

On the other hand, a pulse width tWN4' of the PWM signal PWMOUTN on the negative phase side will become 0.5 times the cycle tC1', i.e., 0.5tC1'. As a result, an average voltage VoN4' of the output signal AMPOUTN on the negative phase side outputted from the output driver 140 in one over sampling cycle will be "k1×0.5/tCS", which can be obtained by the above-mentioned Formula 3 and shown as "VoN4'=k1×(0+0.5)/tCS=k1×0.5/tCS". As can be seen from this value, the average voltage VoN4' of the output signal AMPOUTN on the negative phase side in one over sampling cycle is also the same as the average voltage VoN4 to be outputted at the time when the voltage level is normal. In other words, it is not influenced by fluctuations in the power supply voltage VDD.

When Power Supply Voltage VDD is Lower than Normal Voltage Level

Next, a case in which the power supply voltage VDD to be supplied to the output driver 140 is lower than a normal voltage level will be described with reference to FIG. 4. In this operation, the VCO control voltage generator 170 is outputs a control voltage having a voltage level based on the power supply voltage VDD which is lower than the normal voltage level. Therefore, the cycle of the PWM clock to be outputted from the VCO 160 will become tC1" (>tC1), which is longer than in the case where the power supply voltage VDD is at normal voltage level.

Here, as shown in FIG. 4, when the n*fs clock indicating a start of the over sampling cycle is outputted from the timing control circuit 110 to the VCO control circuit 180, the VCO control circuit 180 will reset a counter (not shown) at a rising edge of the n*fs clock and assert the oscillation enable signal OSCEN with respect to the VCO 160. Thereby, the VCO 160 will start oscillating based on the control voltage inputted from the VCO control voltage generator 170, i.e., based on the control voltage having a lower voltage level than a voltage level at normal times. Then the signal oscillated at the VCO 160 will be inputted to the pulse width modulation circuit 130 and the VCO control circuit 180, respectively, as a PWM clock having a cycle tC1" (>tC1).

As mentioned earlier, the VCO control circuit 180, to which the PWM clock is inputted, counts the number of PWM clock inputs with the counter (not shown). For instance, at a falling edge of the PWM clock, the VCO control circuit 180 will increment the count number of the counter by as much as one. Moreover, when the number of PWM clocks necessary for generating the PWM signals PWMOUTP and PWMOUTN for one cycle are inputted, the VCO control circuit 180 will deassert the oscillation enable signal OSCEN which was asserted with respect to the VCO 160. In this embodiment, when the count number of the counter becomes '5', the VCO control circuit 180 will stop outputting the oscillation enable signal OSCEN. Thereby, the VCO 160 will stop oscillating.

In this way, in this embodiment, by stopping the VCO 160 and thus stop outputting the PWM clock during the extra period in the over sampling cycle, it is possible to prevent the start timing of the next over sampling cycle and the rising edge of the PWM clock from going out of alignment.

In the meantime, to the pulse width modulation circuit 130 to which the PWM clock is inputted, the PWM data outputted from the over sampling/ΔΣ modulation circuit 120 is also inputted.

Here, if the PWM data is '0', for instance, the pulse width modulation circuit 130 will output a PWM signal having a pulse width of 0.5 cycles of the PWM clock, as a PWM signal PWMOUTP on the positive phase side, and will output a PWM signal having a pulse width of 4.5 cycles of the PWM clock, as a PWM signal PWMOUTN on the negative phase side. Accordingly, a pulse width tWP0" of the PWM signal PWMOUTP on the positive phase side will become 0.5 times the cycle tC1", i.e., 0.5tC1". As a result, an average voltage VoP0" of the output signal AMPOUTP on the positive phase side outputted from the output driver 140 in one over sampling cycle will be "k1×0.5/tCS", which can be obtained by the above-mentioned Formula 3 and shown as "VoP0"=k1×(0+0.5)/tCS=k1×0.5/tCS". As can be seen from this value, the average voltage VoP0" of the output signal AMPOUTP on the positive phase side in one over sampling cycle is the same as the average voltage VoP0 to be outputted at the time when the voltage level is normal. In other words, it is not influenced by fluctuations in the power supply voltage VDD.

On the other hand, a pulse width tWN0" of the PWM signal PWMOUTN on the negative phase side will become 4.5 times the cycle tC1", i.e., 4.5tC1". As a result, an average voltage VoN0" of the output signal AMPOUTN on the negative phase side outputted from the output driver 140 in one over sampling cycle will be "k1×4.5/tCS", which can be obtained by the above-mentioned Formula 3 and shown as "VoN0"=k1×(4+0.5)/tCS=k1×4.5/tCS". As can be seen from this value, the average voltage VoN0" of the output signal AMPOUTN on the negative phase side in one over sampling cycle is also the same as the average voltage VoN0 to be outputted at the time when the voltage level is normal. In other words, it is not influenced by fluctuations in the power supply voltage VDD.

If the PWM data is '1', for instance, a pulse width tWP1" of the PWM signal PWMOUTP on the positive phase side will become 1.5 times the cycle tC1", i.e., 1.5tC1". As a result, an average voltage VoP1" of the output signal AMPOUTP on the positive phase side outputted from the output driver 140 in one over sampling cycle will be "k1×1.5/tCS", which can be obtained by the above-mentioned Formula 3 and shown as "VoP1"=k1×(1+0.5)/tCS=k1×1.5/tCS". As can be seen from this value, the average voltage VoP1" of the output signal AMPOUTP on the positive phase side in one over sampling cycle is the same as the average voltage VoP1 to be outputted at the time when the voltage level is normal. In other words, it is not influenced by fluctuations in the power supply voltage VDD.

On the other hand, a pulse width tWN1" of the PWM signal PWMOUTN on the negative phase side will become 3.5 times the cycle tC1", i.e., 3.5tC1". As a result, an average voltage VoN1" of the output signal AMPOUTN on the negative phase side outputted from the output driver 140 in one over sampling cycle will be "k1×3.5/tCS", which can be obtained by the above-mentioned Formula 3 and shown as "VoN1"=k1×(3+0.5)/tCS=k1×3.5/tCS". As can be seen from this value, the average voltage VoN1" of the output signal AMPOUTN on the negative phase side in one over sampling cycle is also the same as the average voltage VoN1 to be outputted at the time when the voltage level is normal. In other words, it is not influenced by fluctuations in the power supply voltage VDD.

If the PWM data is '2', for instance, a pulse width tWP2" of the PWM signal PWMOUTP on the positive phase side will become 2.5 times the cycle tC1", i.e., 2.5tC1". As a result, an average voltage VoP2" of the output signal AMPOUTP on the positive phase side outputted from the output driver 140 in one over sampling cycle will be "k1×2.5/tCS", which can be obtained by the above-mentioned Formula 3 and shown as "VoP2"=k1×(2+0.5)/tCS=k1×2.5/tCS". As can be seen from this value, the average voltage VoP2" of the output signal AMPOUTP on the positive phase side in one over sampling cycle is the same as the average voltage VoP2 to be outputted at the time when the voltage level is normal. In other words, it is not influenced by fluctuations in the power supply voltage VDD.

On the other hand, a pulse width tWN2" of the PWM signal PWMOUTN on the negative phase side will become 2.5 times the cycle tC1", i.e., 2.5tC1". As a result, an average voltage VoN2" of the output signal AMPOUTN on the negative phase side outputted from the output driver 140 in one over sampling cycle will be "k1×2.5/tCS", which can be obtained by the above-mentioned Formula 3 and shown as "VoN2"=k1×(2+0.5)/tCS=k1×2.5/tCS". As can be seen from this value, the average voltage VoN2" of the output signal AMPOUTN on the negative phase side in one over sampling cycle is also the same as the average voltage VoN2 to be outputted at the time when the voltage level is normal. In other words, it is not influenced by fluctuations in the power supply voltage VDD.

If the PWM data is '3', for instance, a pulse width tWP3" of the PWM signal PWMOUTP on the positive phase side will become 3.5 times the cycle tC1", i.e., 3.5tC1". As a result, an average voltage VoP3" of the output signal AMPOUTP on the positive phase side outputted from the output driver 140 in one over sampling cycle will be "k1×3.5/tCS", which can be obtained by the above-mentioned Formula 3 and shown as "VoP3"=k1×(3+0.5)/tCS=k1×3.5/tCS". As can be seen from this value, the average voltage VoP3" of the output signal AMPOUTP on the positive phase side in one over sampling cycle is the same as the average voltage VoP3 to be outputted at the time when the voltage level is normal. In other words, it is not influenced by fluctuations in the power supply voltage VDD.

On the other hand, a pulse width tWN3" of the PWM signal PWMOUTN on the negative phase side will become 1.5 times the cycle tC1", i.e., 1.5tC1". As a result, an average voltage VoN3" of the output signal AMPOUTN on the negative phase side outputted from the output driver 140 in one over sampling cycle will be "k1×1.5/tCS", which can be obtained by the above-mentioned Formula 3 and shown as "VoN3"=k1×(1+0.5)/tCS=k1×1.5/tCS". As can be seen from this value, the average voltage VoN3" of the output signal AMPOUTN on the negative phase side in one over sampling cycle is also the same as the average voltage VoN3 to be outputted at the time when the voltage level is normal. In other words, it is not influenced by fluctuations in the power supply voltage VDD.

If the PWM data is '4', for instance, a pulse width tWP4" of the PWM signal PWMOUTP on the positive phase side will become 4.5 times the cycle tC1", i.e., 4.5tC1". As a result, an average voltage VoP4" of the output signal AMPOUTP on the positive phase side outputted from the output driver 140 in one over sampling cycle will be "k1×4.5/tCS", which can be obtained by the above-mentioned Formula 3 and shown as "VoP4"=k1×(4+0.5)/tCS=k1×4.5/tCS". As can be seen from this value, the average voltage VoP4" of the output signal AMPOUTP on the positive phase side in one over sampling cycle is the same as the average voltage VoP4 to be outputted at the time when the voltage level is normal. In other words, it is not influenced by fluctuations in the power supply voltage VDD.

On the other hand, a pulse width tWN4" of the PWM signal PWMOUTN on the negative phase side will become 0.5 times the cycle tC1", i.e., 0.5tC1". As a result, an average voltage VoN4" of the output signal AMPOUTN on the negative phase side outputted from the output driver 140 in one over sampling cycle will be "k1×0.5/tCS", which can be obtained by the above-mentioned Formula 3 and shown as "VoN4"=k1×(0+0.5)/tCS=k1×0.5/tCS". As can be seen from this value, the average voltage VoN4" of the output signal AMPOUTN on the negative phase side in one over sampling cycle is also the same as the average voltage VoN4 to be outputted at the time when the voltage level is normal. In other words, it is not influenced by fluctuations in the power supply voltage VDD.

As described above, the amp 100 according to the first embodiment of the present invention has a control voltage generator 170 and a VCO 160 which generate a PWM clock having a frequency dependent on a voltage level of a power supply voltage VDD, and a pulse width modulation circuit 130 which generates, based on the PWM clock, PWM signals PWMOUTP and PWMOUTN having a pulse width proportional to PWM data.

In this embodiment, by making the frequency of the PWM clock be dependent on the voltage level of the power supply voltage, it is possible to make the pulse width of the PWM signals PWMOUTP and PWMOUTN, which are generated based on the PWM clock, be dependent on the voltage level of the power supply voltage VDD. Therefore, even when the voltage level of the power supply voltage VDD drops down, it is possible to widen/narrow the time width of the PWM signals PWMOUTP and PWMOUTN by decreasing the frequency of the PWM clock. At this time, by adjusting the amount of frequency change in the PWM clock with respect to fluctuations in the power supply voltage VDD such that the product of the power supply voltage VDD and the PWM signal PWMOUTP or PWMOUTN is kept constant, it is possible to keep the average voltage of the output signals AMPOUTP and AMPOUTN constant, the output signals AMPOUTP and AMPOUTN being, for instance, output signals from a driving circuit (e.g., output driver 140, etc.) disposed at the subsequent stage of the pulse width modulation circuit 130 and operating based on the power supply voltage VDD. Therefore, in this embodiment, when the power supply voltage VDD becomes higher, areas of the output signals AMPOUTP and AMPOUTN will be kept constant by narrowing the PWM clock. On the other hand, when the power supply voltage VDD becomes lower, areas of the output signals AMPOUTP and AMPOUTN will be kept constant by widening the PWM clock. As a result, it will become possible to prevent the output signals AMPOUTP and AMPOUTN from being influenced by fluctuations in the power supply voltage VDD. Moreover, in this embodiment, since it is not necessary to use a switching regulator or a series regulator, it is possible to prevent possible power loss and an increase in the mounting area, weight, etc., of the mounting base. Furthermore, in this embodiment, since it is not necessary to arrange a comparatively large feed back loop including a ΔΣ modulation circuit, it is possible to prevent a delay from occurring, and thereby, it is possible to achieve stable operation.

In addition, in this embodiment, by changing the frequency of the PWM clock with the power supply voltage VDD of the output driver 140, it is possible to moderate the average voltage of the output signals AMPOUTP and AMPOUTN from the output driver 140 even when the power supply voltage VDD fluctuates, and therefore, it is possible to allow larger power supply fluctuations.

Furthermore, in this embodiment, since correction of the PWM signals PWMOUTP and PWMOUTN against fluctuations in the power supply voltage VDD is done within each over sampling cycle, troublesome tones are hardly generated as compared to a case in which the correction is done discretely over multiple over sampling cycles.

Second Embodiment

Now, a second embodiment of the present invention will be described in detail with reference to the drawings. In the following description, for the same structural elements as those in the first embodiment, the same reference numbers will be used, and redundant explanations thereof will be omitted. Moreover, the structure which will not be mentioned in particular is the same as that in the first embodiment.

This embodiment will show an example of a D class amplifier circuit (hereinafter to be referred to as an amp) which operates on the basis of a single PWM signal. However, the present invention is not limited to such condition, and it may also be a D class amplifier circuit which operates on the basis of two PWM signals which are in a reversed phase relationship, as in the case of the first embodiment.

Figure 5:
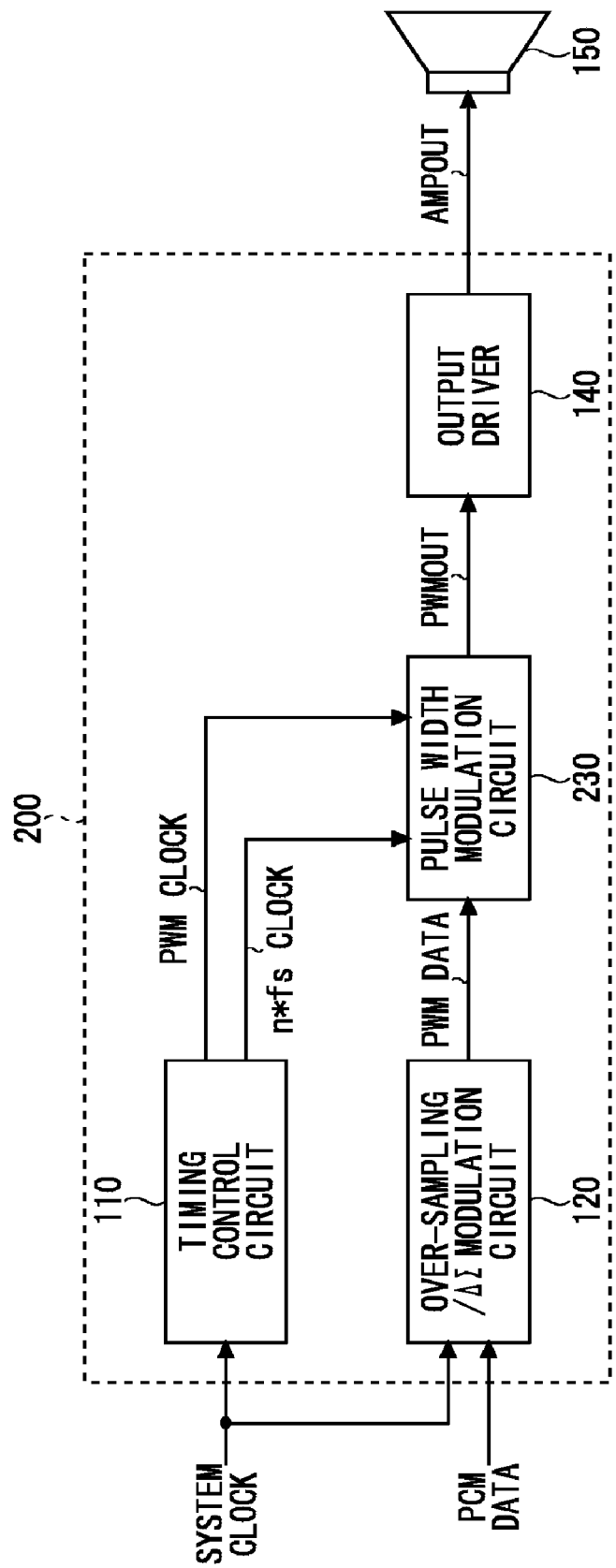
FIG. 5 is a block diagram showing an amplifier according to a second embodiment of the present invention.
Figure 6:
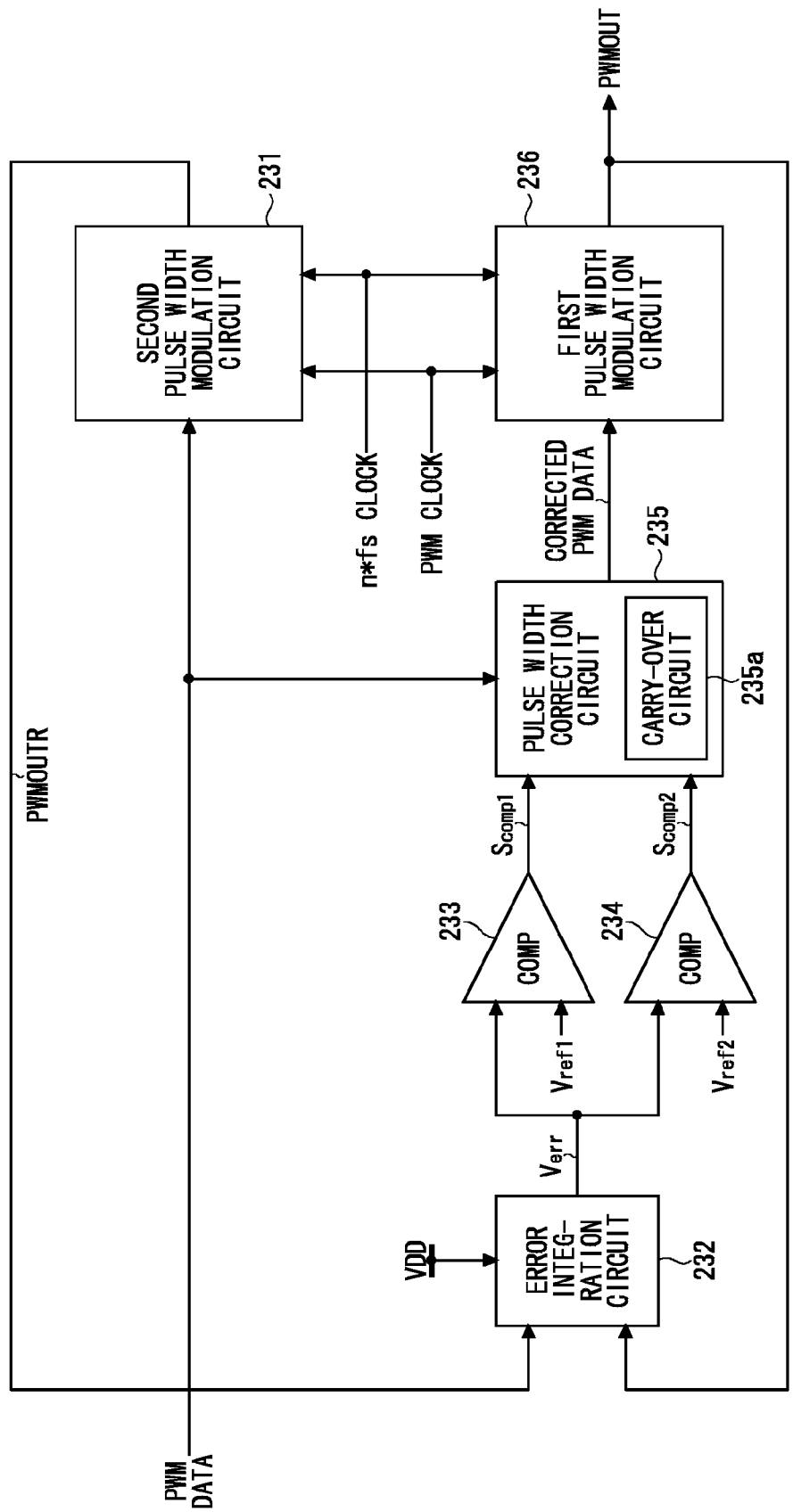
FIG. 6 is a block diagram showing an example of the structure of a pulse width modulation circuit according to the second embodiment of the present invention.
Figure 7:
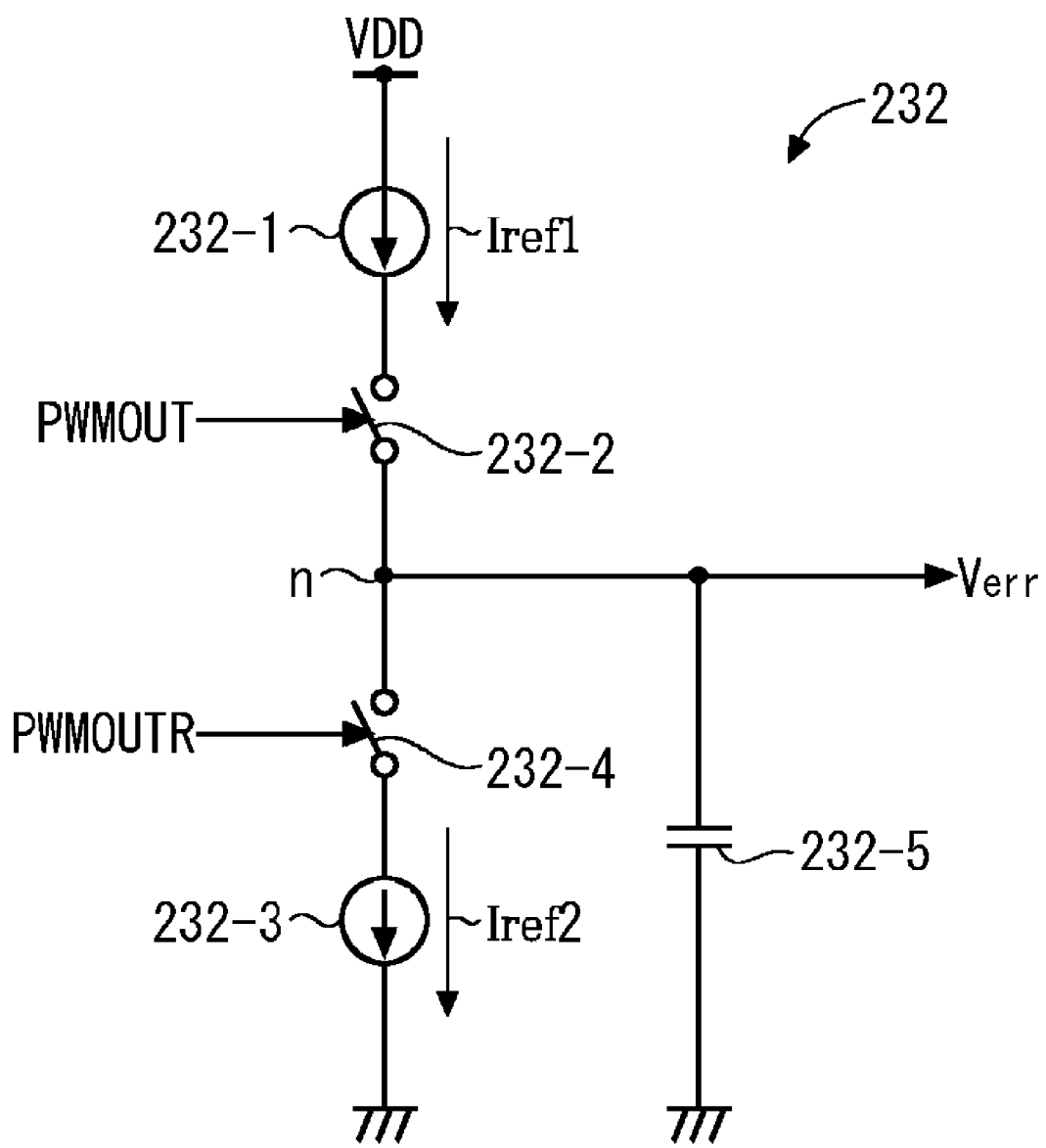
FIG. 7 is a circuit diagram showing an example of the structure of an error integration circuit according to the second embodiment of the present invention.
Figure 8A:
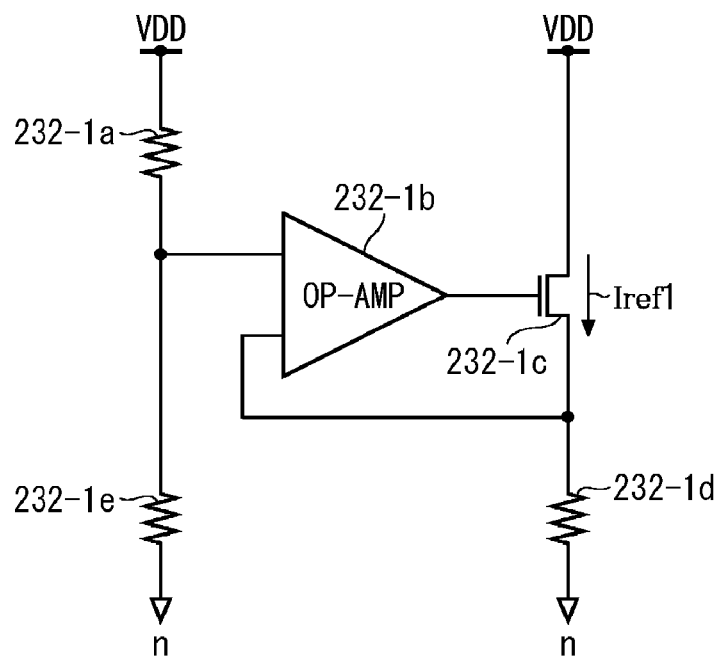
FIG. 8A is a circuit diagram showing an example of the structure of a first current source shown in FIG. 7.
Figure 8B:
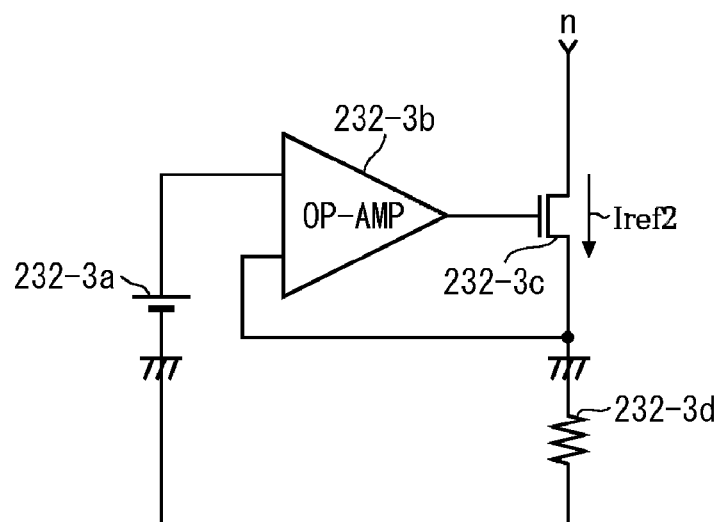
FIG. 8B is a circuit diagram showing an example of the structure of a second current source shown in FIG. 7.

FIG. 5 is a block diagram showing an amp 200 according to the second embodiment of the present invention. FIG. 6 is a block diagram showing an example of the structure of a pulse width modulation circuit 230 according to this embodiment. FIG. 7 is a circuit diagram showing an example of the structure of an error integration circuit 232 arranged in the pulse width modulation circuit 230 according to this embodiment. FIG. 8A is a circuit diagram showing an example of the structure of a first current source 232-1 shown in FIG. 7, and FIG. 8B is a circuit diagram showing an example of the structure of a second current source 232-3 shown in FIG. 7. FIG. 9 is a waveform diagram showing operation waveforms of signals in the amp 200.

Structure

Now, the entire structure of the amp 200 according to the second embodiment of the present invention will be described. Again, in the following description of this embodiment, for the same structural elements as those in the first embodiment, the same reference numbers will be used, and redundant explanations thereof will be omitted.

As shown in FIG. 5, the amp 200 has a timing control circuit 110, an over sampling/ΔΣ modulation circuit 120, a pulse width modulation circuit 230, and an output driver 140. The amp 200 will drive a speaker 150 using an output signal AMPOUTP from the output driver 140.

In this structure, the structures of the timing control circuit 110, the over sampling/ΔΣ modulation circuit 120 and the output driver are the same as in the amp 100 according to the first embodiment, and therefore, detailed descriptions thereof will be omitted.

The pulse width modulation circuit 230 in this embodiment will accumulate the difference between an output signal AMPOUT outputted from the output driver 140 under an ideal state and an output signal AMPOUT actually outputted from the output driver 140, correct the PWM data based on the accumulated difference, and generate a PWM signal PWMOUT based on the corrected PWM data. Here, an ideal state means a state in which the power supply voltage VDD is at a normal voltage level.

Structure of Pulse Width Modulation Circuit

Here, an example of the structure of the pulse width modulation circuit 230 will be described in detail with reference to the drawing. As shown in FIG. 6, the pulse width modulation circuit 230 has a second pulse width modulation circuit 231, a first pulse width modulation circuit 236, an error integration circuit 232, comparators 233 and 234, and a pulse width correction circuit 235.

In this structure, PWM data outputted from the over sampling/ΔΣ modulation circuit 120 will be inputted directly to the second pulse width modulation circuit 231 as it is. To the second pulse width modulation circuit 231, a PWM clock (i.e., a predetermined clock) and an n*fs clock generated by the timing control circuit 110 based on the system clock will also be inputted. In this particular embodiment, the system clock can be used as is as the PWM clock. The second pulse width modulation circuit 231 will generate a PWM signal having a pulse width (i.e., time width) proportional to the PWM data (i.e., second data) based on the PWM clock (hereinafter, this PWM signal will be referred to as a reference PWM signal PWMOUTR, i.e., a second signal).

In the meantime, to the first pulse width modulation circuit 236, corrected PWM data of which value is being corrected by the pulse width correction circuit 235 will be inputted. As with the second pulse width modulation circuit 231, a PWM clock (i.e., a predetermined clock) and an n*fs clock generated by the timing control circuit 110 based on the system clock will be inputted to the first pulse width modulation circuit 236. The first pulse width modulation circuit 236 will generate a PWM signal PWMOUT (i.e., a first signal) having a pulse width (i.e., time width) proportional to the corrected PWM data (i.e., first data) based on the PWM clock.

The reference PWM signal PWMOUTR generated by the second pulse width modulation circuit 231 will be inputted to the error integration circuit 232. Likewise, the PWM signal PWMOUT generated by the first pulse width modulation circuit 236 will also be inputted to the error integration circuit 232. In this embodiment, the error integration circuit 232 serves as a circuit for calculating the difference between the current amount of an output signal AMPOUT outputted from the output driver 140 under an ideal state, i.e., an output signal AMPOUT outputted at the time when the power supply voltage VDD is at a normal voltage level, and the current amount of an output signal AMPOUT actually outputted from the output driver 140, i.e., an output signal AMPOUT actually outputted from the output driver 140 dependent on fluctuation in the power supply voltage VDD, and then integrating the calculated difference. The error integration circuit 232 will output this value of integrated difference as an error signal Verr (i.e., third value).

The error signal Verr outputted from the error integration circuit 232 will be inputted to the comparators 233 and 234, respectively. To one of the two comparators 233, a reference voltage Vref1 (i.e., first predetermined value) on the positive phase side will also be inputted in addition to the error signal Verr. The comparator 233 will compare the error signal Verr and the reference voltage Vref1, and when the value of the error signal Verr exceeds the value of the reference voltage Vref1, the comparator 233 will output a correction signal Scomp1 for decrementing the PWM data by as much as one.

On the other hand, to the other one of the two comparators 234, a reference voltage Vref2 (i.e., second predetermined value) on the negative phase side will also be inputted in addition to the error signal Verr. The comparator 234 will compare the error signal Verr and the reference voltage Vref2, and when the value of the error signal Verr falls below the value of the reference voltage Vref2, the comparator 234 will output a correction signal Scomp2 for incrementing the PWM data by as much as one.

The correction signal Scomp1 outputted from the comparator 233 and the correction signal Scomp2 outputted from the comparator 234 are inputted to the pulse width correction circuit 235. To the pulse width correction circuit 235, the PWM data outputted from the over sampling/ΔΣ modulation circuit 120 will also be inputted. In case when the correction signal Scomp1 is inputted from the comparator 233, for instance, the pulse width correction circuit 235 will decrement the PWM data by as much as one and output it as corrected PWM data. On the other hand, when the correction signal Scomp2 is inputted from the comparator 234, for instance, the pulse width correction circuit 235 will increment the PWM data by as much as one and output it as corrected PWM data.

In this embodiment, however, if the PWM data and the corrected PWM data are five-valued data as in the case of the first embodiment, for instance, the PWM data cannot be incremented by as much as one when it is at the maximum value '4'. Moreover, when the PWM data is at the minimum value '0', for instance, it cannot be decremented by as much as one. Accordingly, in this embodiment, the pulse width correction circuit 235 has a carry-over circuit 235a for carrying the correction over to the next PWM data.

The carry-over circuit 235a includes a judgment circuit for determining as to whether the PWM data is '4' or '0'. Moreover, the carry-over circuit 235a includes a counter for incrementing the counter value by as much as one based on the correction signal Scomp2 inputted at the time when the PWM data is '4', and for decrementing the counter value by as much as one based on the correction signal Scomp1 inputted at the time when the PWM data is '0'. Here, this counter stores a predetermined value which can be noted at the time when it is at an initial state (this value is referred to as the initial value), and will increase or decrease the initial value based on the correction signal Scomp1 or Scomp2.

Furthermore, in this embodiment, at the time when present PWM data is not '4' and when the counter value in the carry-over circuit 235a is larger than the initial value, the pulse width correction circuit 235 will increment the PWM data by as much as the difference between the counter value and the initial value. At this time, the carry-over circuit 235a will decrement the counter value by as much as the incremented value of the PWM data. However, when the PWM data reaches the maximum value (i.e., '4' in this embodiment), the pulse width correction circuit 235 will carry the rest of the difference over to the next PWM data.

On the other hand, at the time when present PWM data is not '0' and when the counter value in the carry-over circuit 235a is smaller than the initial value, the pulse width correction circuit 235 will decrement the PWM data by as much as the difference between the counter value and the initial value. At this time, the carry-over circuit 235a will increment the counter value by as much as the decremented value of the PWM data. However, when the PWM data reaches the minimum value (i.e., '0' in this embodiment), the pulse width correction circuit 235 will carry the rest of the difference over to the next PWM data.

The corrected PWM data outputted from the pulse width correction circuit 235 as described above will be inputted to the first pulse width modulation circuit 236. As mentioned earlier, the first pulse width modulation circuit 236 will generate a PWM signal PWMOUT having a pulse width proportional to the corrected PWM data based on the inputted PWM clock. The generated PWM signal PWMOUT will be outputted to the output driver 140 shown in FIG. 5, and at the same time, will be fed back to the above-described error integration circuit 232.

Structure of Error Integration Circuit

Now, an example of the structure of the error integration circuit 232 will be described in detail with reference to the drawings. As shown in FIG. 7, the error integration circuit 232 has a first current source 232-1 that outputs a current approximately proportional to the power supply voltage VDD, a first switch 232-2 that switches ON/OFF the output of the first current source 232-1 based on the PWM signal PWMOUT, a second current source 232-3 that outputs a current which is independent of the power supply voltage VDD and which has opposite polarity to the current outputted by the first current source 232-1, a second switch 232-4 that switches ON/OFF the output of the second current source 232-3 based on the reference PWM signal PWMOUTR, and a capacitor 232-5 for adding and integrating a current Iref1 (i.e., first current) outputted from the first current source 232-1 and a current Iref2 (i.e., second current) outputted from the second current source 232-3.

The first current source 232-1 is connected in between the power supply voltage VDD and a node n. As shown in FIG. 8A, the first current source 232-1 has a resistance 232-1a, a resistance 232-1d, a resistance 232-1e, an operational amp (hereinafter to be referred to as an OP amp) 232-1b, and a transistor 232-1c. To a gate of the transistor 232-1c, an output of the OP amp 232-1b will be applied. To one of the inputs of the OP amp 232-1b, the power supply voltage VDD will be inputted via the resistance 232-1a. To the other input of the OP amp 232-1b, a drain of the transistor 232-1c is connected. In this structure, at the time when the first switch 232-2 receives the PWM signal PWMOUT and is switched ON, the current Iref1 approximately proportional to the power supply voltage VDD will flow into the node n via the transistor 232-1c and the resistance 232-1d.

The second current source 232-3 is connected in between the ground and the node n. As shown in FIG. 8B, the second current source 232-3 has a constant voltage source 232-3a, an OP amp 232-3b, a transistor 232-3c, and a resistance 232-1d. To a gate of the transistor 232-3c, an output of the OP amp 232-3b will be applied. To one of the inputs of the OP amp 232-3b, a positive polarity of the constant voltage source 232-3a is connected. To the other input of the OP amp 232-3b, a drain of the transistor 232-3c is connected. In this structure, at the time when the second switch 232-4 receives the reference PWM signal PWMOUTR and is switched ON, the current Iref2 independent of the power supply voltage VDD will flow from the node n into the ground via the transistor 232-3c and the resistance 232-3d.

In this embodiment, the current Iref1 flowing to the first current source 232-1 is set such that it will become equal to the current Iref2 flowing to the second current source 232-1 at the time when the power supply voltage VDD is at a normal voltage level.

As described above, the first current source 232-1 will let the current Iref1 flow through the node n only during a period of time when the first switch 232-2 is being switched ON by the PWM signal PWMOUT. Therefore, during a period of time corresponding to a pulse width of the PWM signal PWMOUT generated based on the corrected PWM data, the current Iref1 dependent on the power supply voltage VDD will be accumulated in the capacitor 232-5 arranged at the subsequent stage of the node n. In other words, an electrical charge (i.e., tW×Iref1 (first value)) in an amount corresponding to a value obtained by multiplying a pulse width tW of the PWM signal PWMOUT generated based on the corrected PWM data by the current Iref1 approximately proportional to the power supply voltage VDD will be accumulated in the capacitor 232-5.

In the meantime, as described above, the second current source 232-3 will let the current Iref2 flow through the node n only during a period of time when the second switch 232-4 is being switched ON by the reference PWM signal PWMOUTR. However, as mentioned earlier, the current Iref2 has opposite polarity to the current Iref1. Therefore, an electrical charge (i.e., tWR×Iref2 (second value)) in an amount corresponding to a value obtained by multiplying a pulse width tWR of the reference PWM signal PWMOUTR generated based on the non-corrected PWM data by the current Iref2 independent of the power supply voltage VDD will be discharged from the capacitor 232-5 arranged at the subsequent stage of the node n.

Here, a description of the voltage level of the error signal Verr outputted from the error integration circuit 232 will be given. For instance, when it is not necessary to correct the PWM data, i.e., when the voltage level of the error signal Verr (hereinafter this voltage level will be simply referred to as Verr) does not exceed the reference voltage Vref1 in the comparator 233 and does not fall below the reference voltage Vref2 in the comparator 234 at the same time, the potential difference $\Delta$Verr in one over sampling cycle tCS (i.e., predetermined cycle) of the error signal Verr can be expressed by the following Formula 4. In Formula 4, 'tC' indicates one cycle of the PWM clock, 'Dpwm' indicates the PWM data, 'Iref1' indicates the current value of the current Iref1, and 'Iref2' indicates the current value of the current Iref2.

$$\Delta Verr=(Dpwm+0.5)\times tC\times Iref1-(Dpwm+0.5)\times tC\times Iref2=(Dpwm+0.5)\times tC\times(Iref1-Iref2)$$ Formula 4

Furthermore, provided that the actual voltage level of the power supply voltage VDD is 'VDD' and the normal voltage level of the power supply voltage VDD is 'VDDa', the current Iref1 can be expressed by the following Formula 5. In Formula 5, 'kv' and 'VDDa' are both constants.

$$Iref1=k2\times(VDD-VDDa)+Iref2$$ Formula 5

Now, by assigning Formula 5 to Formula 4, the potential difference $\Delta$Verr in one over sampling cycle tCS of the error signal Verr can be expressed by the following Formula 6.

$$\Delta Verr=(Dpwm+0.5)\times tC\times k2\times(VDD-VDDa)$$ Formula 6

As can be understood from Formula 6, when the power supply voltage VDD is high, for instance, the potential difference $\Delta$Verr will become positive, and therefore, the voltage level of the error signal Verr will rise. On the other hand, when the power supply voltage VDD is low, for instance, the potential difference $\Delta$Verr will become negative, and therefore, the voltage level of the error signal Verr will drop.

Operation

Now, operation of the amp 200 according to the second embodiment of the present invention will be explained. In the following explanation, an example in which the PWM data is '2' will be given.

When the power supply voltage VDD to be supplied to the output driver 140 is at a normal voltage level, a potential difference $\Delta$Verr of the error signal Verr in the error integration circuit 232 will become '0'. Therefore, the voltage level of the error signal Verr to be outputted from the error integration circuit 232 will be at a constant level. Accordingly, the PWM data will not be corrected at the pulse width modulation circuit 230, and a PWM signal PWMOUT having a pulse width (tW0) proportional to the original PWM data will be outputted from the pulse width modulation circuit 230 (q.v., over sampling cycles tCS1 and tCS2 in FIG. 9).

In the meantime, when the power supply voltage VDD is lower than a normal voltage level, the potential difference $\Delta$Verr of the error signal Verr in the error integration circuit 232 will become negative. Therefore, the voltage level of the error signal Verr to be outputted from the error integration circuit 232 will drop, and then fall below the reference voltage Vref2 which has been inputted to the comparator 234 in the pulse width modulation circuit 230 at a predetermined timing t1. When the error voltage Verr falls below the reference voltage Vref2, the pulse width modulation circuit 235 will generate corrected PWM data equivalent to the PWM data being incremented by as much as one. In this embodiment, here, corrected PWM data which is '3' is supposed to be generated. Accordingly, a PWM signal PWMOUT having a pulse width (tW1) proportional to the corrected PWM data will be outputted from the first pulse width modulation circuit 236. In other words, a PWM signal PWMOUT having a pulse width wider than the PWM signal PWMOUT to be outputted at the time when the power supply voltage VDD is at a normal level by as much as one cycle of the PWM clock will be outputted from the first width modulation circuit 236 (q.v., over sampling cycle tCS2 in FIG. 9).

In the meantime, when the power supply voltage VDD is higher than a normal voltage level, the potential difference ΔVerr of the error signal Verr in the error integration circuit 232 will become positive. Therefore, the voltage level of the error signal Verr to be outputted from the error integration circuit 232 will rise, and then exceed the reference voltage Vref1 which has been inputted to the comparator 233 in the pulse width modulation circuit 230 at a predetermined timing t2. When the error voltage Verr exceeds the reference voltage Vref1, the pulse width modulation circuit 235 will generate corrected PWM data equivalent to the PWM data being decremented by as much as one. In this embodiment, here, corrected PWM data which is '1' is supposed to be generated. Accordingly, a PWM signal PWMOUT having a pulse width (tW2) proportional to the corrected PWM data will be outputted from the first pulse width modulation circuit 236. In other words, a PWM signal PWMOUT having a pulse width narrower than the PWM signal PWMOUT to be outputted at the time when the power supply voltage VDD is at a normal level by as much as one cycle of the PWM clock will be outputted from the first width modulation circuit 236 (q.v., over sampling cycle tCS2 in FIG. 9).

As described above, the amp 200 according to the second embodiment of the present invention includes: a first pulse width modulation circuit 236 which generates, based on the PWM clock, a PWM signal PWMOUT having a pulse width proportional to corrected PWM data; a second pulse width modulation circuit 231 which generates, based on the PWM clock, a reference PWM signal PWMOUTR having a pulse width proportional to PWM data; an error integration circuit 232 which outputs an error signal Verr produced by integrating the difference between a value obtained by multiplying a current Iref1 dependent on a power supply voltage VDD by the pulse width of the PWM signal PWMOUT and a value obtained by multiplying a current Iref2 independent of the power supply voltage VDD by the pulse width of the reference PWM signal PWMOUTR; and a pulse width correction circuit 235 which generates corrected PWM data by correcting PWM data when the error signal Verr exceeds a reference voltage Vref1 or when the error signal Verr falls below a reference voltage Vref2.

The value obtained by multiplying the current Iref1 dependent on the power supply voltage VDD by the pulse width of the PWM signal PWMOUT indicates the current amount of an output signal AMPOUT which is to be actually outputted from a driving circuit (e.g., output driver 140, etc.) disposed at the subsequent stage of the first pulse width modulation circuit 236. In the meantime, the value obtained by multiplying the current Iref2 independent of the power supply voltage VDD by the pulse width of the reference PWM signal PWMOUTR indicates a current amount of an output signal AMPOUT which is to be actually outputted from a driving circuit (e.g., output driver 140, etc.) disposed at the subsequent stage of the first pulse width modulation circuit, at the time when a voltage level of the power supply voltage VDD is at a normal voltage level. Here, the difference between these two values is obtained, and when the error signal Verr obtained by integrating this difference between the two values falls below a predetermined value, the PWM data will be corrected based on it. Accordingly, in this embodiment, it is possible to keep the average voltage of the output signal AMPOUT constant, the output signal AMPOUT being, for instance, the output signal from a driving circuit (e.g., output driver 140, etc.) disposed at the subsequent stage of the first pulse width modulation circuit 236 and operating based on the power supply voltage VDD. Therefore, in this embodiment, when the integration value of the difference between the output signal AMPOUT actually outputted from the output driver 140 and the output signal AMPOUT outputted under an ideal state surpasses a predetermined value (e.g., Vref1), an area of the output signal AMPOUT will be kept constant by correcting the PWM data and thus narrowing the pulse width of the PWM signal PWMOUT. Moreover, when the integration value of the difference between the output signal AMPOUT actually outputted from the output driver 140 and the output signal AMPOUT outputted under an ideal state falls below a predetermined value (e.g., Vref2), an area of the output signal AMPOUT will be kept constant by correcting the PWM data and thus widening the pulse width of the PWM signal PWMOUT. As a result, it will become possible to prevent the output signal AMPOUT from being influenced by fluctuations in the power supply voltage VDD. Moreover, in this embodiment, since it is not necessary to use a switching regulator or a series regulator, it is possible to prevent possible power loss, and an increase in the mounting area, weight, etc., of the mounting base. Furthermore, in this embodiment, since it is not necessary to arrange a comparatively large feed back loop including a ΔΣ modulation circuit, it is possible to prevent a delay from occurring, and thereby, it is possible to achieve stable operation.

In addition, in this embodiment, by correcting the pulse width of the power supply voltage VDD of the output driver 140, it is possible to have less change in the average voltage of the output signal AMPOUT outputted from the output driver 140 as compared to a case where no correction is done. Therefore, in this embodiment, it is possible to allow larger power supply fluctuations.

The second embodiment of the present invention shows an example in which correction is to be done on the output (i.e., PWM data) from the over sampling/ΔΣ modulation circuit 120. However, the present invention is not limited to such condition, and it is also possible to arrange such that correction should be done on a feed back quantization value in the over sampling/ΔΣ modulation circuit 120. Since such arrangement is easily predictable based on the arrangement as described with respect to this embodiment, a detailed description thereof will be omitted here.

While the preferred embodiments of the invention have been described using specific terms, such description is for illustrative purposes only, and it is to be understood that changes and variations may be made without departing from the spirit or the scope of the following claims.

This application claims priority to Japanese Patent Application No. 2005-315016. The entire disclosures of Japanese Patent Application No. 2005-315016 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

What is claimed is:

1. An amplifier circuit comprising:
    a first clock generator configured to output a first clock having a frequency which is dependent on a voltage level of a power supply voltage, wherein the frequency of the first clock is decreased when the voltage level of the power supply voltage is decreased, and wherein the frequency of the first clock is increased when the voltage level of the power supply voltage is increased; and
    a pulse width modulator configured to generate a signal having a duration proportional to data based on the first clock.

2. The amplifier circuit according to claim 1, wherein the first clock generator comprises:
    a control voltage generator configured to output a control voltage that is proportional to the power supply voltage, and
    a voltage controlled oscillator configured to generate the first clock by oscillating based on the control voltage.

3. The amplifier circuit according to claim 1, further comprising:
    a second clock generator configured to output a second clock having a cycle which is longer by more than a predetermined number of cycles of the first clock; and
    an oscillation control circuit configured to turn off the first clock generator until the next second clock rises, when a period of the predetermined number of cycles of the first clock is passed after the second clock rose.

4. The amplifier circuit according to claim 3, wherein the second clock generator is configured to output the second clock based on an externally input third clock.

5. An amplifier circuit comprising:
    a first pulse width modulator configured to generate a first signal having a first duration based on a predetermined clock, the first duration being proportional to first data;
    a second pulse width modulator configured to generate a second signal which has a second duration based on the predetermined clock the second duration being proportional to second data;
    an error integration circuit configured to output a first value which is obtained by integrating a difference between second and third values, the second value being obtained by multiplying a first current that is proportional to a power supply voltage by a duration of the first signal, the third value being obtained by multiplying a second current that is nonproportional to the power supply voltage by a duration of the second signal; and
    a correction circuit configured to generate the first data by correcting the second data if the first value exceeds a first predetermined value or if the first value falls below a second predetermined value.

6. The amplifier circuit according to claim 5, wherein the correction circuit is configured to generate the first data by decreasing the second data if the first value exceeds the first predetermined value or by increasing the second data if the first value falls below the second predetermined value.

7. The amplifier circuit according to claim 5, wherein the first pulse width modulator is configured to generate the first signal at each predetermined cycle,
    the second pulse width modulator is configured to generate the second signal at each predetermined cycle,
    the error integration circuit is configured to output the first value at each predetermined cycle, and
    the correction circuit is configured to generate the first data by correcting the second data at each predetermined cycle, determine whether the second value is a maximum value or a minimum value, and if the second data is the maximum data or the minimum data, carry over the correction of the second data to the next cycle.

8. The amplifier circuit according to claim 5, wherein the error integration circuit comprises
    a capacitor configured to store the second and third value,
    a first current source configured to generate a first current which is proportional to the power supply voltage,
    a first switch configured to switch a connection between the first current source and the capacitor on or off based on the first signal,
    a second current source configured to generate a second current which is nonproportional to the power supply voltage, and
    a second switch configured to switch a connection between the second current source and the capacitor on or off based on the second signal.

* * * * *